United States Patent
Kim

(10) Patent No.: US 12,300,709 B2
(45) Date of Patent: May 13, 2025

(54) IMAGE SENSING DEVICE

(71) Applicant: SK hynix Inc., Icheon-si (KR)

(72) Inventor: Sie Uoo Kim, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 843 days.

(21) Appl. No.: 17/237,740

(22) Filed: Apr. 22, 2021

(65) Prior Publication Data

US 2022/0020801 A1 Jan. 20, 2022

(30) Foreign Application Priority Data

Jul. 20, 2020 (KR) .................. 10-2020-0089571

(51) Int. Cl.
| | |
|---|---|
| *H01L 27/146* | (2006.01) |
| *G02B 5/28* | (2006.01) |
| *G02B 26/00* | (2006.01) |
| *H10N 30/20* | (2023.01) |
| *H10N 30/80* | (2023.01) |

(52) U.S. Cl.
CPC ........ *H01L 27/14625* (2013.01); *G02B 5/284* (2013.01); *G02B 26/001* (2013.01); *H01L 27/14645* (2013.01); *H10N 30/206* (2023.02); *H10N 30/802* (2023.02)

(58) Field of Classification Search
CPC ...... G02B 5/284; G02B 5/288; G02B 5/0833; G02B 5/0858; G02B 5/282; G02B 5/28; G02B 26/001–002; G02B 26/007–008; G02B 26/0858; H01L 27/146; H01L 27/14625; H01L 27/14645; H01L 27/14621; H01L 27/14647; H10N 30/802; H10N 30/206; G01N 33/49; G01N 21/27; G01N 21/45; G01N 21/7703; G01J 3/26; G01J 3/50–501; G01J 3/46; G01J 3/02; G01J 3/4535; G01J 3/453; G01J 3/477; G01J 3/4537; G01J 3/2823; G01J 11/00; G01J 2009/0257; G02F 1/21; G01B 9/02; G01B 9/021; G01B 9/04; G01B 11/2441
USPC ......................................................... 359/579
See application file for complete search history.

(56) References Cited

U.S. PATENT DOCUMENTS

| | | | |
|---|---|---|---|
| 5,444,244 A  *  | 8/1995 | Kirk | ........................ B82Y 35/00 |
| | | | 977/873 |
| 6,384,458 B1 | 5/2002 | Bode et al. | |
| 9,397,476 B2 * | 7/2016 | Baier | ..................... H01S 5/0427 |

(Continued)

FOREIGN PATENT DOCUMENTS

| | | |
|---|---|---|
| CN | 1591079 A | 3/2005 |
| CN | 1769956 A | 5/2006 |

(Continued)

OTHER PUBLICATIONS

Yoon, S. et al., "Bifunctional Etalon-Electrode to Realize High-Performance Color Filter Free Image Sensor," ACS Nano 2019, 13, pp. 2127-2135.

(Continued)

*Primary Examiner* — Jyotsna V Dabbi
(74) *Attorney, Agent, or Firm* — Perkins Coie LLP

(57) ABSTRACT

An image sensing device may include: a variable color filter configured to vary the wavelength range of light transmitted thereby; and a pixel array comprising a plurality of unit pixels each configured to generate a pixel signal corresponding to the intensity of light having penetrated the variable color filter.

20 Claims, 9 Drawing Sheets

(56) References Cited

U.S. PATENT DOCUMENTS

| | | | |
|---|---|---|---|
| 10,249,669 B1 | 4/2019 | Fine et al. | |
| 2002/0113948 A1 | 8/2002 | Yokoyama et al. | |
| 2007/0153288 A1* | 7/2007 | Wang | G01J 3/027 |
| | | | 356/519 |
| 2010/0134803 A1 | 6/2010 | Baier et al. | |
| 2012/0001289 A1 | 1/2012 | Ahn et al. | |
| 2014/0354999 A1* | 12/2014 | Englund | G01J 3/45 |
| | | | 356/456 |
| 2017/0146400 A1* | 5/2017 | Zywicki | B81B 7/00 |

FOREIGN PATENT DOCUMENTS

| | | |
|---|---|---|
| CN | 102741671 A | 10/2012 |
| CN | 103843328 A | 6/2014 |
| CN | 105633116 A | 6/2016 |
| KR | 100727266 B1 | 6/2007 |
| WO | 2013051477 A1 | 4/2013 |

OTHER PUBLICATIONS

Notification to Grant Patent Right for Invention for CN Appl. No. 202110418989.8, mailed on Oct. 31, 2024, 6 pages with English translation.

* cited by examiner

IMAGE SENSING DEVICE

PRIORITY CLAIM AND CROSS-REFERENCES TO RELATED APPLICATION

This patent document claims the priority and benefits of Korean patent application number 10-2020-0089571, filed on Jul. 20, 2020, the disclosure of which is incorporated herein by reference in its entirety.

TECHNICAL FIELD

The technology and implementations disclosed in this patent document generally relate to an image sensing device which senses lights in various wavelength ranges.

BACKGROUND

An image sensing device is a device for capturing an image using the property of semiconductor that reacts to light that is incident thereon to produce an image. Recently, with the development of computer industry, the demand for advanced image sensing devices has been increasing in various electronic devices such as smart phones, digital cameras, video game equipment, devices for use with IOT (Internet of Things), robots, security cameras and medical micro cameras.

The image sensing devices may be roughly divided into CCD (Charge Coupled Device) image sensing devices and CMOS (Complementary Metal Oxide Semiconductor) image sensing devices. The CCD image sensing devices generate less noise and have better image quality than CMOS image sensing devices. However, the CMOS image sensing devices have a simpler and more convenient driving scheme, and thus may be preferred in some applications. CMOS image sensing devices may integrate a signal processing circuit can be integrated in a single chip, making it easy to miniaturize the sensors for implementation in a product, with the added benefit of consuming lower power consumption. CMOS image sensors can be fabricated using a CMOS fabrication technology, which results in low manufacturing cost. CMOS image sensing devices have been widely used due to their suitability for implementation in mobile devices.

SUMMARY

Various embodiments of the disclosed technology are related to an image sensing device capable of acquiring a color image even without a CFA (Color Filter Array).

In one aspect, an image sensing device is provided to include: a variable color filter configured to receive incident light on the image sensing device and operable to vary a wavelength range of light transmitted thereby; and a pixel array located to receive a portion of the incident light transmitted from the variable color filter and comprising a plurality of unit pixels, each unit pixel configured to generate a pixel signal corresponding to an intensity of light having transmitted through the variable color filter.

In another aspect, an image sensing device is provided to include a substrate including a pixel array including a plurality of unit pixels; a variable color filter disposed over the substrate and configured to, receive a filter control signal, and vary a wavelength range of light transmitted by the variable color filter in response to the filter control signal; and a filter driver coupled to the variable color filter and configured to generate the filter control signal for controlling the variable color filter, and apply the filter control signal to the variable color filter.

In accordance with the present embodiments, the image sensing device in accordance with the present embodiment may exclude a CFA (Color Filter Array) configured to allow each of the pixels to receive a different color of light, which makes it possible to solve various problems of the CFA, such as a reduction in receiving sensitivity, an occurrence of crosstalk, and an increase in level of difficulty in a CFA design/process.

DETAILED DESCRIPTION

Hereafter, various embodiments will be described with reference to the accompanying drawings. However, it should be understood that the present disclosure is not limited to specific embodiments, but includes various modifications, equivalents and/or alternatives of the embodiments.

Figure 1:
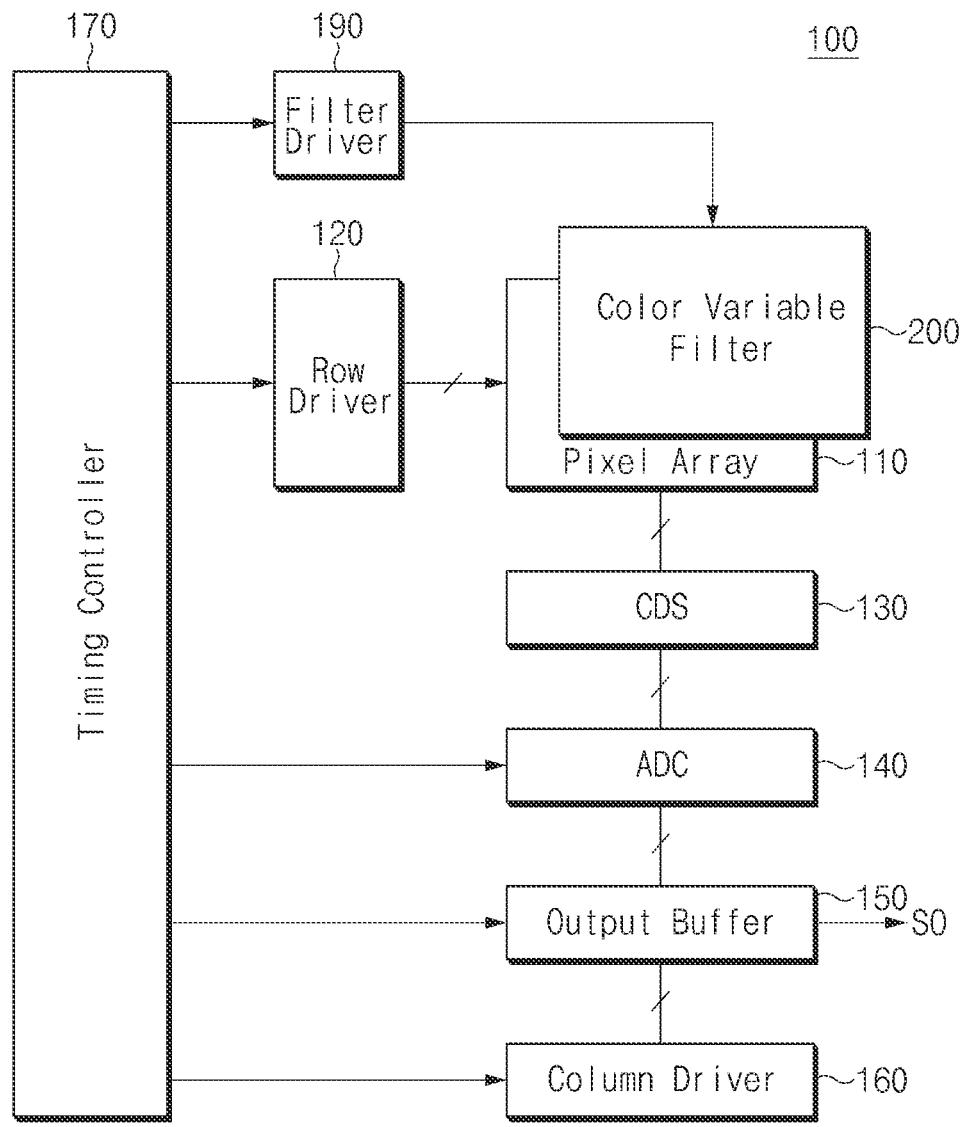
FIG. 1 is a block diagram illustrating an example of an image sensing device in accordance with an embodiment of the disclosed technology.

FIG. 1 is a block diagram illustrating an image sensing device based on an embodiment of the disclosed technology.

Referring to FIG. 1, the image sensing device 100 may include a pixel array 110, a row driver 120, a correlated double sampler (CDS) 130, an analog-digital converter (ADC) 140, an output buffer 150, a column driver 160, a timing controller 170, a filter driver 190 and a variable color filter 200. The components of the image sensing device 100 illustrated in FIG. 1 are discussed by way of example only, and this patent document encompasses numerous other changes, substitutions, variations, alterations, and modifications.

The pixel array 110 may include a plurality of unit imaging pixels arranged in rows and columns. Each of the unit pixels may generate a pixel signal corresponding to the intensity of light having penetrated the variable color filter 200. In one example, the plurality of unit imaging pixels can be arranged in a two dimensional pixel array including rows and columns. In another example, the plurality of unit imaging pixels can be arranged in a three dimensional pixel array. The plurality of unit pixels may convert an optical signal into an electrical signal on a unit pixel basis or a pixel group basis, where unit pixels in a pixel group share at least certain internal circuitry. The pixel array 110 may receive driving signals, including a row selection signal, a pixel reset signal and a transmission signal, from the row driver 120. Upon receiving the driving signal, corresponding imaging pixels in the pixel array 110 may be activated to perform the operations corresponding to the row selection signal, the pixel reset signal, and the transmission signal.

The row driver 120 may activate the pixel array 110 to perform certain operations on the imaging pixels in the corresponding row based on commands and control signals provided by controller circuitry such as the timing controller 170. In some implementations, the row driver 120 may select one or more imaging pixels arranged in one or more rows of the pixel array 110. The row driver 120 may generate a row selection signal to select one or more rows among the plurality of rows. The row decoder 120 may sequentially enable the pixel reset signal for resetting imaging pixels corresponding to at least one selected row, and the transmission signal for the pixels corresponding to the at least one selected row. Thus, a reference signal and an image signal, which are analog signals generated by each of the imaging pixels of the selected row, may be sequentially transferred to the CDS 130. The reference signal may be an electrical signal that is provided to the CDS 130 when a sensing node of an imaging pixel (e.g., floating diffusion node) is reset, and the image signal may be an electrical signal that is provided to the CDS 130 when photocharges generated by the imaging pixel are accumulated in the sensing node.

CMOS image sensors may use the correlated double sampling (CDS) to remove undesired offset values of pixels known as the fixed pattern noise by sampling a pixel signal twice to remove the difference between these two samples. In one example, the correlated double sampling (CDS) may remove the undesired offset value of pixels by comparing pixel output voltages obtained before and after photocharges generated by incident light are accumulated in the sensing node so that only pixel output voltages based on the incident light can be measured. In some embodiments of the disclosed technology, the CDS 130 may sequentially sample and hold voltage levels of the reference signal and the image signal, which are provided to each of a plurality of column lines from the pixel array 110. That is, the CDS 130 may sample and hold the voltage levels of the reference signal and the image signal which correspond to each of the columns of the pixel array 110.

In some implementations, the CDS 130 may transfer the reference signal and the image signal of each of the columns as a correlate double sampling signal to the ADC 140 based on control signals from the timing controller 170.

The ADC 140 is used to convert analog CDS signals to digital signals. In some implementations, the ADC 140 may be implemented as a ramp-compare type ADC. The ramp-compare type ADC may include a comparator circuit for comparing the analog pixel signal with a ramp signal that ramps up or down, and a counter for counting until a voltage of the ramp signal matches the analog pixel signal. In some embodiments of the disclosed technology, the ADC 140 may convert the correlate double sampling signal generated by the CDS 130 for each of the columns into a digital signal, and output the digital signal. The ADC 140 may perform a counting operation and a computing operation based on the correlate double sampling signal for each of the columns and a ramp signal provided from the timing controller 170.

The ADC 140 may include a plurality of column counters. Each column of the pixel array 110 is coupled to a column counter, and image data can be generated by converting the correlate double sampling signals received from each column into digital signals using the column counter. In another embodiment of the disclosed technology, the ADC 140 may include a global counter to convert the correlate double sampling signals corresponding to the columns into digital signals using a global code provided from the global counter.

The output buffer 150 may temporarily hold the column-based image data provided from the ADC 140 to output the image data. In one example, the output buffer 150 output the image data provided to the output buffer 150 from the ADC 140 and stored in the output buffer 150 based on control signals of the timing controller 170. The output buffer 150 may provide an interface to compensate for data rate differences or transmission rate differences between the image sensing device 100 and other devices.

The column driver 160 may select a column of the output buffer upon receiving a control signal from the timing controller 170, and sequentially output the image data, which are temporarily stored in the selected column of the output buffer 150. In some implementations, upon receiving an address signal from the timing controller 170, the column driver 160 may generate a column selection signal based on the address signal and select a column of the output buffer 150, outputting the image data as an output signal from the selected column of the output buffer 150.

The timing controller 170 may control operations of the row driver 120, the CDS 130, the ADC 140, the output buffer 150, the column driver 160 and the filter driver 190.

The timing controller 170 may provide the row driver 120, the CDS 130, the ADC 140, the output buffer 150, the column driver 160 and the filter driver 190 with a clock signal required for the operations of the respective components of the image sensing device 100, a control signal for timing control, and address signals for selecting a row or column. In an embodiment of the disclosed technology, the timing controller 170 may include a logic control circuit, a phase lock loop (PLL) circuit, a timing control circuit, a communication interface circuit and others.

The filter driver 190 may generate a filter control signal for operating the variable color filter 200, under control of the timing controller 170. The filter control signal may include two or more signals having predetermined voltage levels, but the scope of the present disclosure is not limited thereto.

The variable color filter 200 may allow a specific wavelength range of light (for example, red, green, blue, magenta, yellow, cyan or the like) among lights incident from the outside of the image sensing device 100 to transmit or penetrate the variable color filter 200, and transfer the light to the pixel array 110. The wavelength range of the light transmitted by the variable color filter 200 may be decided based on the filter control signal received from the filter driver 190. Therefore, the filter driver 190 can adjust the wavelength range of the light to be penetrated through the variable color filter 200 using the filter control signal. The variable color filter 200 may vary the wavelength range of the light to be transmitted depending on the filter control signal received from the filter driver.

When the filter control signal is applied to the variable color filter 200, the variable color filter 200 may transmit a specific wavelength range of light based on the filter control signal to the pixel array 110. Thus, the plurality of unit pixels arranged in a matrix may receive a same color of the light instead of receiving different colors of light through color filters configured in a specific color pattern (for example, a Bayer pattern).

Figure 2:
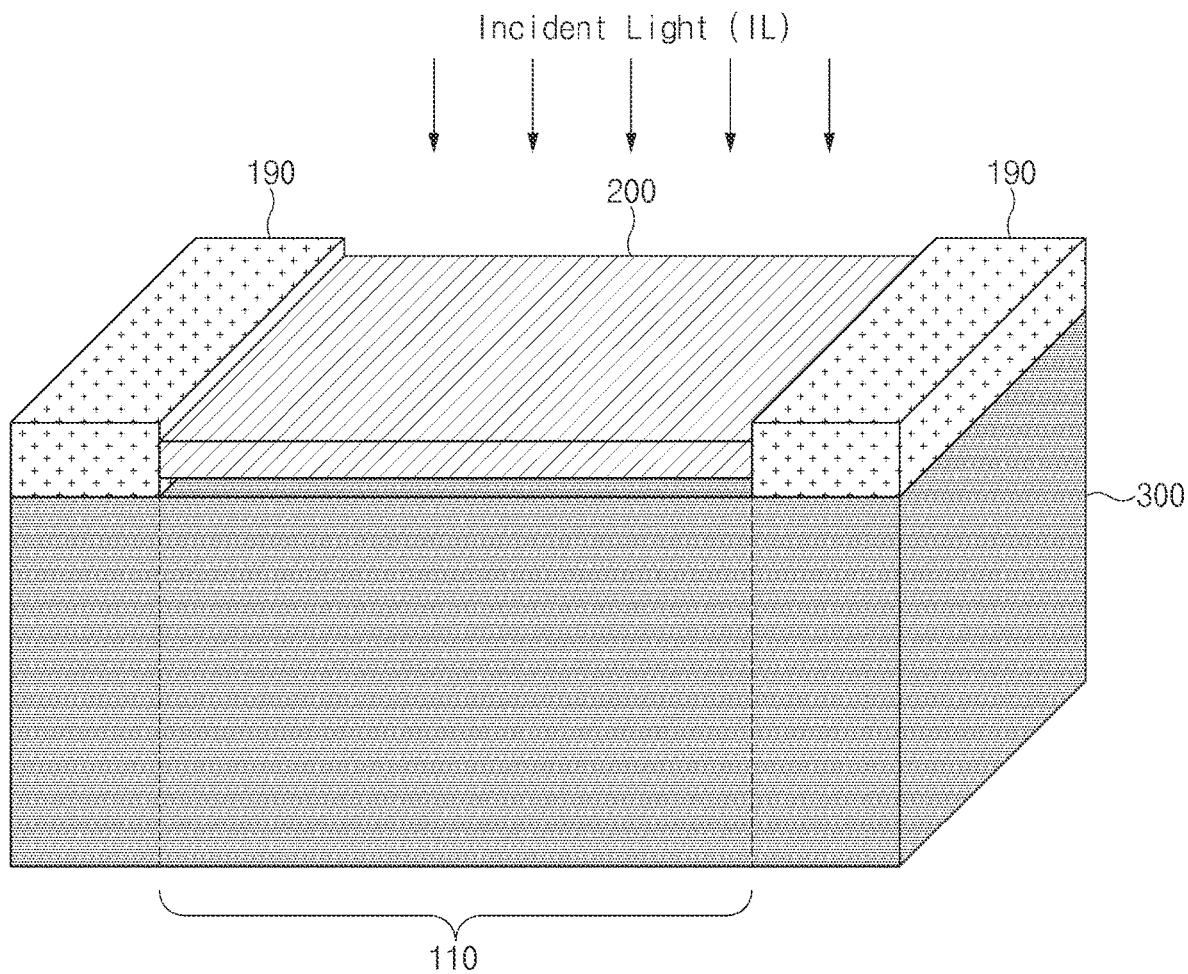
FIG. 2 is a diagram illustrating some of components of the image sensing device illustrated in FIG. 1.

FIG. 2 is a diagram illustrating some of the components of the image sensing device illustrated in FIG. 1.

FIG. 2 illustrates the pixel array 110, the filter driver 190 and the variable color filter 200 among the components of the image sensing device 100 described with reference to FIG. 1.

The pixel array 110 may be formed in a substrate 300.

The substrate 300 may be a semiconductor substrate including top and bottom surfaces facing each other, while the scope of the present disclosure is not limited thereto. The bottom and top surfaces of the substrate 300 may be defined as a front side and a back side, respectively. For example, the substrate 300 may be a P-type or N-type bulk substrate, a substrate obtained by growing a P-type or N-type epitaxial layer in a P-type bulk substrate, or a substrate obtained by growing a P-type or N-type epitaxial layer in an N-type bulk substrate.

The pixel array 110 formed in the substrate 300 may include a plurality of unit pixels arranged in a matrix including rows and columns. The plurality of unit pixels may have various structures and corresponding operations to the structures. In the below, one unit pixel will be described as an example. The unit pixel may include a photoelectric conversion element disposed at an internal location of the substrate 300, and configured to convert incident light into photocharges. The unit pixel may include one or more transistors configured to convert the photocharges, accumulated in the photoelectric conversion element, into an electric signal corresponding to the photocharges. Examples of the transistor may include a transmission transistor, a reset transistor, a source follower, a selection transistor and the like. The unit pixel may be a 3T (Transistor) pixel, 4T pixel or 5T pixel, but the scope of the present disclosure is not limited thereto.

The pixel array 110 illustrated in FIG. 2 may include active pixels to convert incident light into an electrical signal. The substrate 300 may further include optical black pixels or dummy pixels for measuring dark noise.

The variable color filter 200 may be disposed over the substrate 300 so as to overlap the pixel array 110. The variable color filter 200 may have a size corresponding to that of the pixel array 110. The variable color filter 200 may be spaced a predetermined distance apart from the substrate 300. One surface of the variable color filter 200 may receive incident light, and the other surface of the variable color filter 200 may transfer the light which has penetrated the variable color filter 200 to the pixel array 110.

The filter driver 190 may be disposed on one surface of the substrate 300 so as not to overlap the pixel array 110. The filter driver 190 may be disposed on both sides of the variable color filter 200. In some implementations, the filter driver 190 may support two sides of the variable color filter 200 such that the variable color filter 200 is spaced apart from the substrate 300 by a predetermined distance. In some other implementations, the filter driver 190 may be disposed to surround the variable color filter 200 when seen from the top, and support four sides of the variable color filter 200. Thus, the variable color filter 200 is spaced apart from the substrate 300 by a predetermined distance.

The filter driver 190 may provide the filter control signal to the variable color filter 200. For this operation, the filter driver 190 may include a wiring structure for transmitting/receiving the filter control signal.

Figure 3:
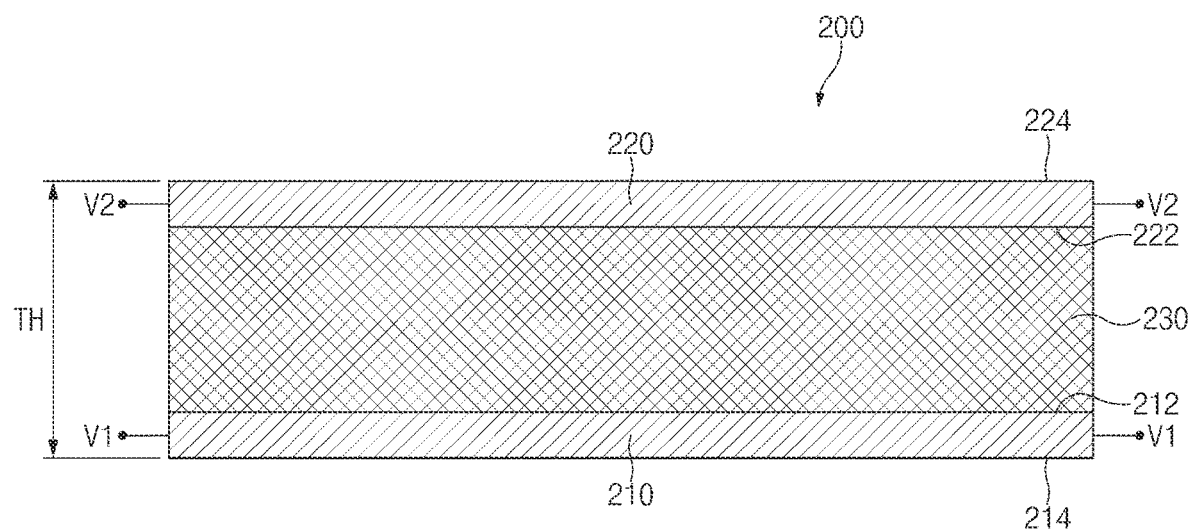
FIG. 3 is a diagram illustrating an example of a variable color filter illustrated in FIG. 2.

FIG. 3 is a diagram illustrating an example of the variable color filter illustrated in FIG. 2.

FIG. 3 illustrates a cross-section of the variable color filter 200 in accordance with the present embodiment. The variable color filter 200 may include a first plate 210, a second plate 220 and a piezoelectric layer 230.

The first plate 210 may be a transparent electrode layer which is disposed over the pixel array 110 so as to overlap the pixel array 110. The first plate 210 may have an area corresponding to the pixel array 110. The first plate 210 may be formed of or include a conductive material having high transmittance (for example, GZO (Gallium Zinc Oxide), BZO (Boron Zinc Oxide), IZO (Indium Zinc Oxide) or ITO (Indium Tin Oxide)). The thickness of the first plate 210 may be set to a proper thickness in consideration of shape stability, conductivity and transmittance. The first plate 210 may receive a first voltage signal V1, and the entire region of the first plate 210 may have a potential corresponding to the first voltage signal V1.

The first plate 210 may have first and second surfaces 212 and 214 disposed on the opposite sides.

The first plate 210 may have a reflecting thin film formed on the first surface 212. For example, the reflecting thin film may include silver (Ag) having high reflectance and conductivity.

The first plate 210 may have an anti-reflection thin film formed on the second surface 214. For example, the anti-reflection thin film may include oxide or nitride, and have a structure in which one or more thin films having a low refractive index and one or more thin films having a high refractive index are alternately disposed.

The second plate 220 may be a transparent electrode layer which is disposed over the piezoelectric layer 230. The second plate 220 may be spaced apart from the first plate 210 by the predetermined distance corresponding to the thickness of the piezoelectric layer 230. The second plate 220 may overlap the pixel array 110 while having an area corresponding to the pixel array 110. The second plate 220 may be formed of or include a conductive material having high transmittance (for example, GZO (Gallium Zinc Oxide), BZO (Boron Zinc Oxide), IZO (Indium Zinc Oxide) or ITO (Indium Tin Oxide)). The thickness of the second plate 220 may be set to a proper thickness in consideration of shape stability, conductivity and transmittance. The second plate 220 may receive a second voltage signal V2, and the entire region of the second plate 220 may have a potential corresponding to the second voltage signal V2.

The above-described first and second voltage signals V1 and V2 may be included in the filter control signal supplied from the filter driver 190.

The second plate 220 may have first and second surfaces 222 and 224 disposed on the opposite sides.

The first surface 222 of the second plate 220 may have a reflecting thin film formed thereon. For example, the reflecting thin film may include silver (Ag) having high reflectance and conductivity.

The second surface 224 of the second plate 220 may have an anti-reflection thin film formed thereon. For example, the anti-reflection thin film may include oxide or nitride, and have a structure in which one or more thin films having a low refractive index and one or more thin films having a high refractive index are alternately disposed.

The first surface 212 of the first plate 210 and the first surface 222 of the second plate 220 may be disposed to face each other, and the second surface 214 of the first plate 210 and the second surface 224 of the second plate 220 may be disposed to face the outside of the variable color filter 200.

The first and second plates 210 and 220 may form a Fabry-Pérot interferometer. The Fabry-Pérot interferometer may indicate a structure in which two thin films each having high transmittance are disposed to overlap each other and facing surfaces of the two thin films are coated with a material having high reflectance. The Fabry-Pérot interferometer may cause multiple interferences for a light incident on one surface of thereof and having a specific wavelength range and thus have relatively high transmittance for the light having specific wavelength range. Such a specific wavelength range may be varied by the distance between the two thin films.

Therefore, the first and second plates 210 and 220 may operate as a color filter which selectively transmits light of a certain color having a specific wavelength range which is decided according to the distance therebetween. In the example, it is assumed that the thicknesses of the first and second plates 210 and 220 are not changed, but the thickness of the piezoelectric layer 230 is changed. When the distance between the first and second plates 210 and 220 is changed or the thickness of the piezoelectric layer 230 is changed, it may indicate that the thickness TH of the variable color filter 200 is changed.

The piezoelectric layer 230 may be disposed between the first and second plates 210 and 220 facing each other, and attached to each of the first and second plates 210 and 220.

The piezoelectric layer 230 may include a piezoelectric material having a piezoelectric characteristic which can exhibit a converse piezoelectric effect. The converse piezoelectric effect may indicate that a mechanical deformation occurs when voltages having a predetermined potential difference are applied to two electrodes positioned at both ends of a material.

A mechanical deformation corresponding to a potential difference between the first voltage signal V1 applied to the first plate 210 positioned on one side of the piezoelectric layer 230 and the second voltage signal V2 applied to the second plate 220 positioned on the other side thereof may occur in the piezoelectric layer 230. The mechanical deformation of the piezoelectric layer 230 may indicate an increase or decrease in thickness of the piezoelectric layer 230.

The piezoelectric material included in the piezoelectric layer 230 may be a transparent material having a piezoelectric characteristic. For example, the piezoelectric material may be boron carbon oxynitrate (BCNO). BCNO may be synthesized as an anisotropic material by intercalating carbon into boron nitride (BN) which is an isotropic material having a hexagonal plate-shaped structure. When an electric field is applied to BCNO which is such an anisotropic material, the piezoelectric characteristic may be implemented through polarization.

The piezoelectric layer 230 may have a thickness that is changed according to a potential difference between the first and second voltage signals V1 and V2, and the distance between the first and second plates 210 and 220 attached to the piezoelectric layer 230 may be decided according to the thickness of the piezoelectric layer 230. According to the distance between the first and second plates 210 and 220, the wavelength range (or color) of light transmitted by the variable color filter 200 forming the Fabry-Pérot interferometer may be decided. Therefore, the filter driver 190 may control the first and second voltage signals V1 and V2 to decide the wavelength range (or color) of light transmitted by the variable color filter 200.

Figure 4:
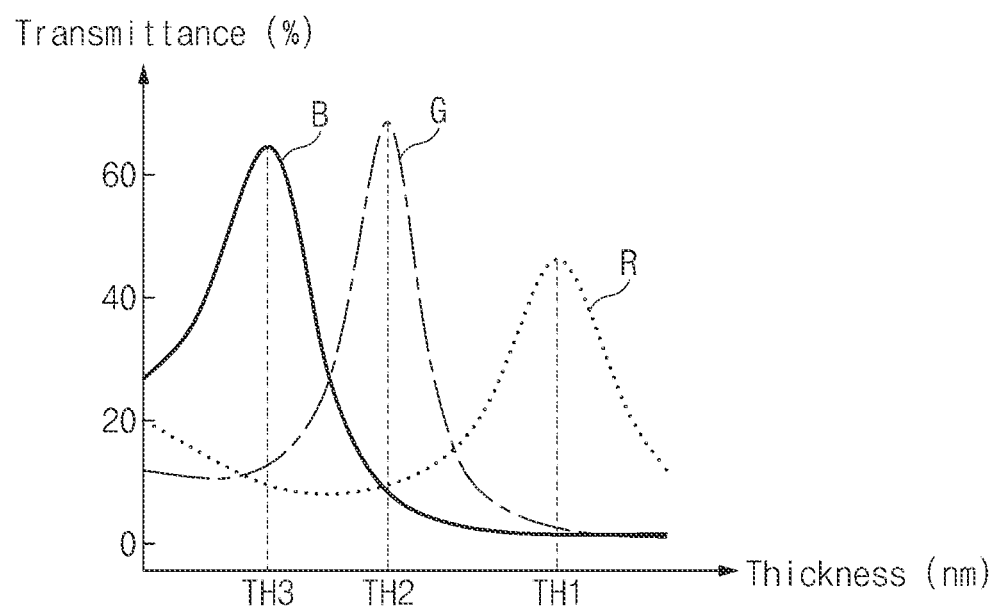
FIG. 4 is a graph illustrating a relationship between a thickness of a variable color filter and a transmittance of light of each color.

FIG. 4 is a graph illustrating the relationship between a thickness of a variable color filter and a transmittance of light for each color.

FIG. 4 illustrates the relationship between the thickness of the variable color filter 200 and the transmittances of light of each color of red, green and blue. Hereafter, the lights corresponding to red, green, and blue will be referred to as 'red light', 'green light' and 'blue light'.

The red light may have a central wavelength of about 655 nm. The green light may have a central wavelength of about 540 nm. The blue light may have a central wavelength of about 460 nm.

When the variable color filter 200 has a first thickness TH1, the variable color filter 200 may have the highest transmittance for the red light. In this case, the variable color filter 200 may operate as a red color filter.

When the variable color filter 200 has a second thickness TH2, the variable color filter 200 may have the highest transmittance for the green light. In this case, the variable color filter 200 may operate as a green color filter.

Finally, when the variable color filter 200 has a third thickness TH3, the variable color filter 200 may have the highest transmittance for the blue light. In this case, the variable color filter 200 may operate as a blue color filter.

The first to third thicknesses TH1 to TH3 may be changed according to the material and structure of the variable color filter 200, and experimentally decided for the material and structure of the variable color filter 200. The first thickness TH1 may be larger than the second thickness TH2, and the second thickness TH2 may be larger than the third thickness TH3.

Figure 5:
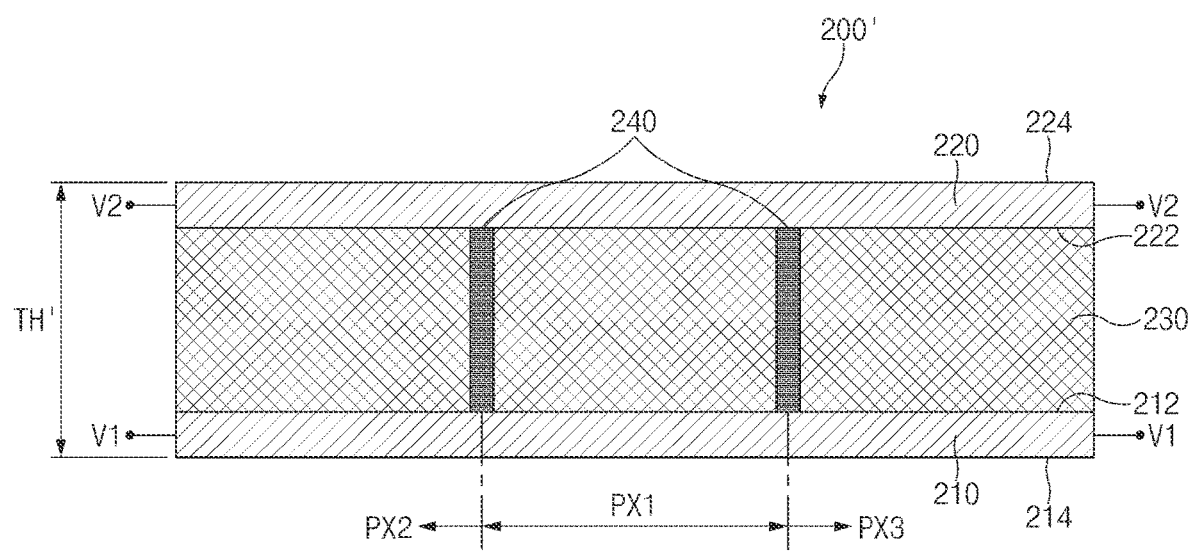
FIG. 5 is a diagram illustrating another example of the variable color filter illustrated in FIG. 2.

FIG. 5 is a diagram illustrating another example of the variable color filter illustrated in FIG. 2.

FIG. 5 illustrates a cross-section of a variable color filter 200' in accordance with an embodiment. The variable color filter 200' may include a first plate 210, a second plate 220, a piezoelectric layer 230 and an optical isolation film 240. The first plate 210, the second plate 220 and the piezoelectric layer 230, which are included in the variable color filter 200', have substantially the same structures and functions as those of the first plate 210, the second plate 220 and the piezoelectric layer 230, respectively, which are described with reference to FIG. 3. Thus, the detailed descriptions thereof will be omitted herein.

FIG. 5 illustrates only regions corresponding to three pixels PX1 to PX3, for convenience of description. However, one of ordinary skilled in the art will appreciate that the variable color filter 200' may be formed in the regions corresponding to more pixels included in the pixel array 110.

The optical isolation film 240 may be disposed along the boundary between pixels that are adjacent to each other and between the first and second plates 210 and 220. As illustrated in FIG. 5, the optical isolation films 240 may be disposed along the boundary between a first pixel PX1 and a second pixel PX2 that are adjacent to each other, and the boundary between the first pixel PX1 and a third pixel PX3 that are adjacent to each other. Thus, the piezoelectric layer 230 and the optical isolation film 240 may be alternately disposed in the row direction or column direction of the pixel array 110.

The optical isolation film 240 may have a mesh structure so as to be disposed along the boundaries among the plurality of pixels arranged in a matrix when seen from the top.

The optical isolation film 240 may have the same thickness (or height) as the piezoelectric layer 230. In some implementations, the optical isolation film 240 may have a width that is experimentally decided to minimize crosstalk between adjacent pixels while raising the light receiving efficiency of each pixel.

The optical isolation film 240 may include a piezoelectric material having a piezoelectric characteristic which can exhibit a converse piezoelectric effect, like the piezoelectric layer 230. Therefore, the optical isolation film 240 may have substantially the same thickness change as the piezoelectric layer 230 in response to a potential difference between the first and second voltage signals V1 and V2. Since the piezoelectric layer 230 and the optical isolation film 240 may have a mechanical deformation corresponding to a potential difference between the first and second voltage signals V1 and V2, it is possible to prevent mechanical distortion or separation between the piezoelectric layer 230 and the optical isolation film 240.

In some implementations, the optical isolation film 240 may block light that is incident in a region of the piezoelectric layer 230 corresponding to a certain pixel from moving to another pixel, thereby preventing optical crosstalk between adjacent pixels (for example, PX1 and PX2). For example, assume that there is no optical isolation film 240. In this case, due to multiple interferences caused by the structure of the variable color filter 200' forming the Fabry-Pérot interferometer, light incident on the piezoelectric layer 230 corresponding to the first pixel PX1 may move to the piezoelectric layer 230 corresponding to another pixel PX2 or PX3. However, by forming the optical isolation film 240 in the piezoelectric layer 230, the optical isolation film 240 may block the light which causes the multiple interferences from moving to the piezoelectric layer 230 corresponding to another pixel PX2 or PX3.

For this operation, the optical isolation film 240 may include a material having a lower refractive index than a piezoelectric material, have a region which is adjacent to the piezoelectric layer 230 and coated with a material having high reflectance, or include a material having high light absorptivity.

Figure 6:
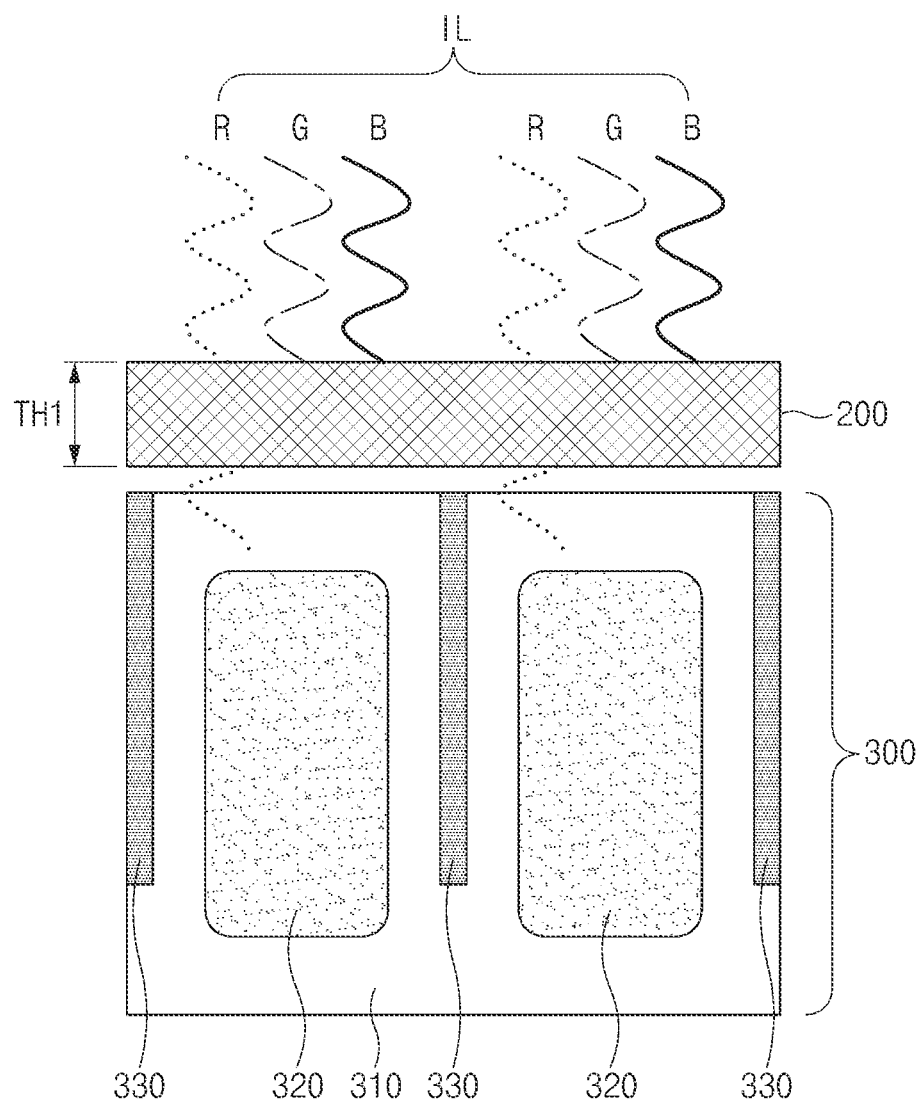
FIG. 6 is a diagram for describing an operation of the variable color filter having a first thickness.

FIG. 6 is a diagram for describing an operation of the variable color filter having a first thickness.

Figure 7:
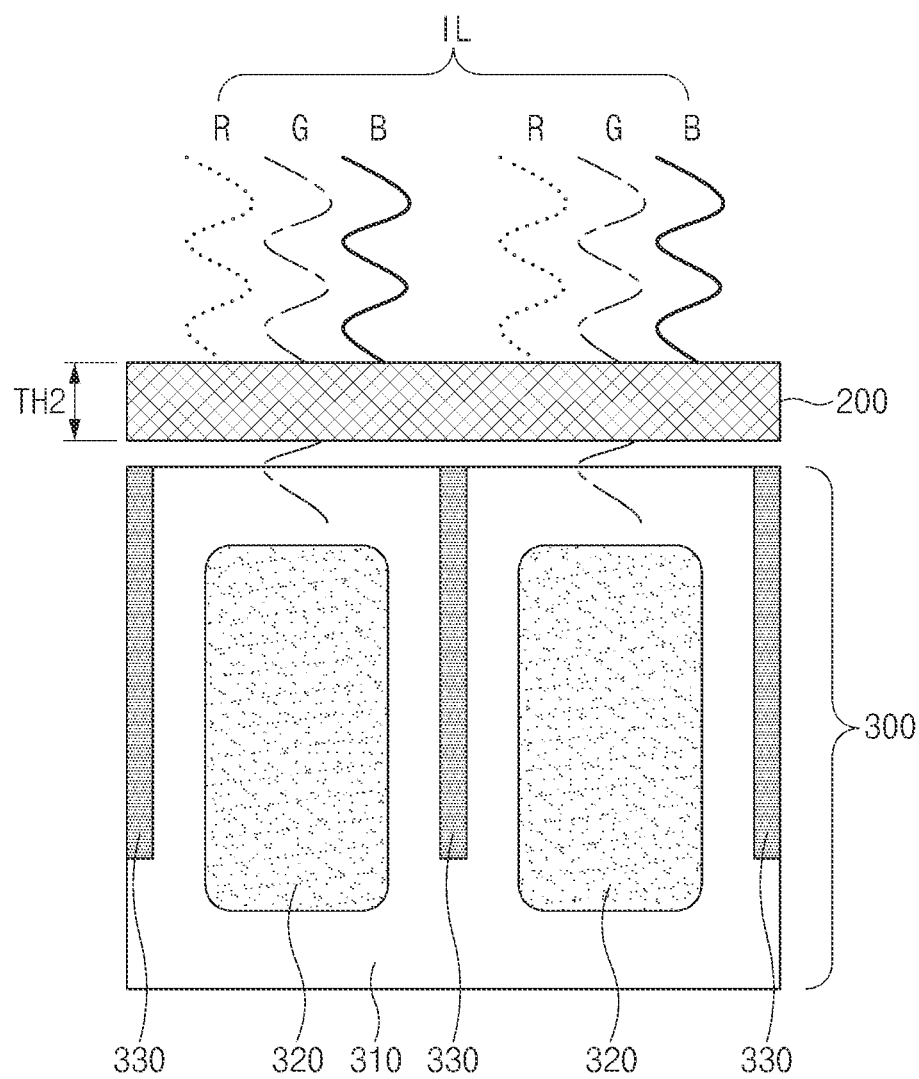
FIG. 7 is a diagram for describing an operation of the variable color filter having a second thickness.
Figure 8:
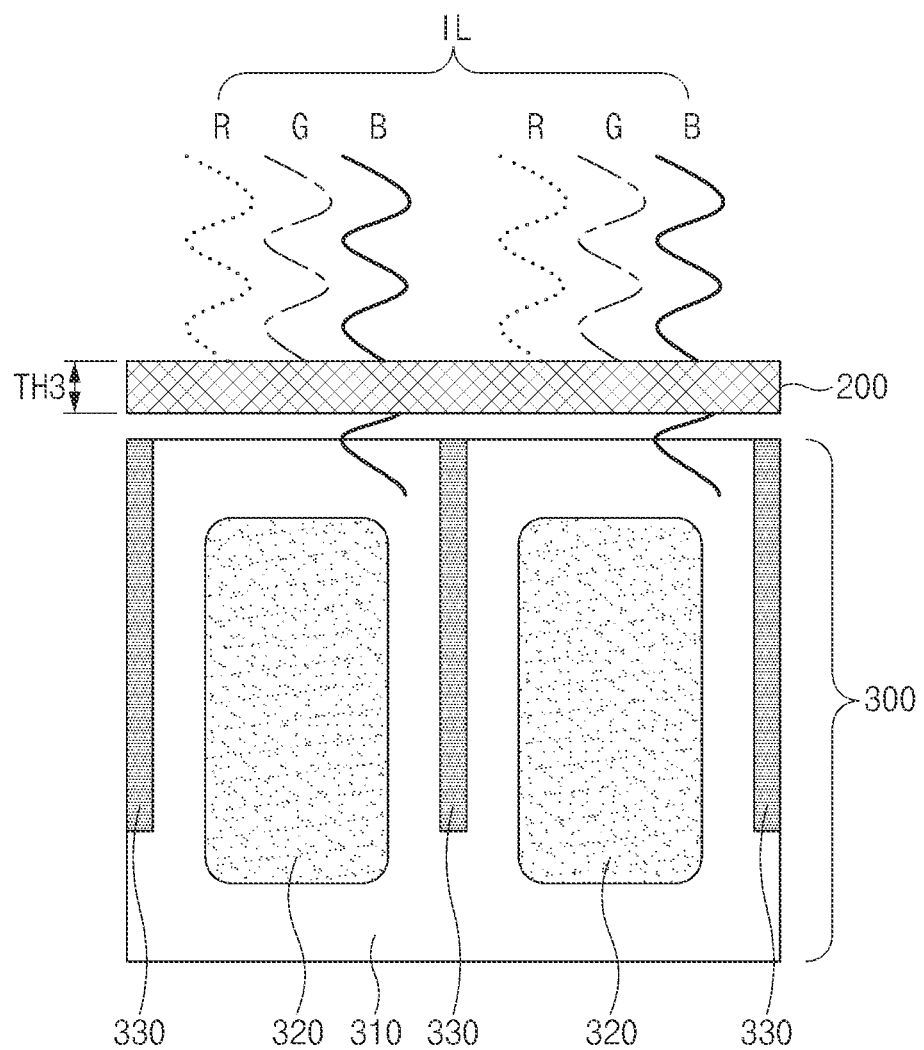
FIG. 8 is a diagram for describing an operation of the variable color filter having a third thickness.

FIG. 6 illustrates the case in which the variable color filter 200 disposed over the substrate 300 has the first thickness TH1. FIGS. 6 to 8 illustrate an embodiment in which the variable color filter 200 is disposed over the substrate 300. However, the technical idea as descried with reference to FIGS. 6 to 8 may be applied to an embodiment in which the variable color filter 200' is disposed on the substrate 300. For convenience of description, FIGS. 6 to 8 illustrate the variable color filter 200 corresponding to only two pixels adjacent to each other. However, it is possible that the variable color filter 200 is disposed over the area corresponding to more pixels of the pixel array 110.

The substrate 300 may include a well region 310, a photoelectric conversion element 320 and an element isolation film 330.

The well region 310 may serve to isolate elements formed in the substrate 300 or provide a PN junction. The well region 310 may be a P-type or N-type epitaxial layer, but the scope of the present disclosure is not limited thereto.

The photoelectric conversion element 320 may be independently formed in each pixel, and generate and accumulate photocharges corresponding to the intensity of incident light. The photoelectric conversion element 320 may be formed as an N-type doping region through an ion implantation process of implanting N-type ions. In an embodiment, the photoelectric conversion element 320 may include a plurality of doping regions staked therein. In this case, a lower doping region may be formed by implanting N+ ions, and an upper doping region may be formed by implanting N- ions. The photoelectric conversion element 320 may be formed across an area as large as possible in the unit pixel, in order to raise a fill factor indicating light receiving efficiency.

The element isolation film 330 may have a vertical and deep trench shape between the adjacent pixels, in order to electrically and optically isolate the photoelectric conversion elements 320 of the adjacent pixels. In an embodiment, the element isolation film 330 may be formed by injecting a material having a lower refractive index than the well region 310 into the vertical and deep trench structure formed through a DPI (Deep Trench Isolation) process.

When the variable color filter 200' is disposed over the substrate 300, the optical isolation film 240 of the variable color filter 200' may be disposed along a virtual extension line of the element isolation film 330 in order to raise the optical crosstalk preventing effect. Thus, the optical isolation film 240 and the element isolation film 330 may be disposed along a same vertical line.

The filter driver 190 may generate a first filter control signal and apply the first filter control signal to the variable color filter 200' to transmit red light R among the red light R, green light G and blue light B which are included in incident light IL.

The first plate 210 may receive the first voltage signal V1 corresponding to the first filter control signal, and the second plate 220 may receive the second voltage signal V2 corresponding to the first filter control signal.

The variable color filter 200 may have the first thickness TH1 decided by a potential difference between the first and second voltage signals V1 and V2 corresponding to the first filter control signal, and the first thickness TH1 of the variable color filter 200 may decide the distance between the first and second plates 210 and 220 attached to the piezoelectric layer 230.

According to the distance between the first and second plates 210 and 220, which corresponds to the first thickness TH1, the wavelength range of light transmitted by the variable color filter 200 forming the Fabry-Pérot interferometer may correspond to the wavelength range of red light. As illustrated in FIG. 4, the variable color filter 200 having the first thickness TH1 may have the highest transmittance for the red light R among the red light R, the green light G and the blue light B, and thus operate as a red color filter. Thus, the variable color filter 200 receiving the first filter control signal may filter lights other than the red light R among the lights included in the incident light IL, and transfer the red light R to the photoelectric conversion element 320.

FIG. 7 is a diagram for describing an operation of the variable color filter having a second thickness.

FIG. 7 illustrates the case in which the variable color filter 200 disposed over the substrate 300 has the second thickness TH2.

FIG. 7 illustrates substantially the same structure as that of FIG. 6 except the thickness of the variable color filter 200. Thus, overlapping descriptions will be omitted herein.

The filter driver 190 may generate a second filter control signal and apply the second filter control signal to the variable color filter 200 to transmit the green light G among the red light R, the green light G and the blue light B which are included in incident light IL.

The first plate 210 may receive the first voltage signal V1 corresponding to the second filter control signal, and the second plate 220 may receive the second voltage signal V2 corresponding to the second filter control signal.

The variable color filter 200 may have the second thickness TH2 decided by a potential difference between the first and second voltage signals V1 and V2 corresponding to the second filter control signal, and the second thickness TH2 of the variable color filter 200 may decide the distance between the first and second plates 210 and 220 attached to the piezoelectric layer 230. The potential difference between the first and second voltage signals V1 and V2, corresponding to the second filter control signal, may be smaller than the potential difference between the first and second voltage signals V1 and V2 corresponding to the first filter control signal.

According to the distance between the first and second plates 210 and 220, which correspond to the second thickness TH2, the wavelength range of light transmitted by the variable color filter 200 forming the Fabry-Pérot interferometer may correspond to the wavelength range of the green light. As illustrated in FIG. 4, the variable color filter 200 having the second thickness TH2 may have the highest transmittance for the green light G among the red light R, the green light G and the blue light B, and thus operate as a green color filter. Thus, the variable color filter 200 receiving the second filter control signal may filter lights other than the green light G among the lights included in the incident light IL, and transfer the green light G to the photoelectric conversion element 320.

FIG. 8 is a diagram for describing an operation of the variable color filter having a third thickness.

FIG. 8 illustrates the case in which the variable color filter 200 disposed over the substrate 300 has the third thickness TH3. FIG. 8 illustrates substantially the same structure as that of FIG. 6 except the thickness of the variable color filter 200. Thus, overlapping descriptions will be omitted herein.

The filter driver 190 may generate a third filter control signal and apply the third filter control signal to the variable color filter 200 to transmit the blue light B among the red light R, the green light G and the blue light B which are included in incident light IL.

The first plate 210 may receive the first voltage signal V1 corresponding to the third filter control signal, and the second plate 220 may receive the second voltage signal V2 corresponding to the third filter control signal.

The variable color filter 200 may have the third thickness TH3 decided by a potential difference between the first and second voltage signals V1 and V2 corresponding to the third filter control signal, and the third thickness TH3 of the variable color filter 200 may decide the distance between the first and second plates 210 and 220 attached to the piezoelectric layer 230. The potential difference between the first and second voltage signals V1 and V2 corresponding to the third filter control signal may be smaller than the potential difference between the first and second voltage signals V1 and V2 corresponding to the second filter control signal.

According to the distance between the first and second plates 210 and 220, which corresponds to the third thickness TH3, the wavelength range of light transmitted by the variable color filter 200 forming the Fabry-Pérot interferometer may correspond to the wavelength range of the blue light. As illustrated in FIG. 4, the variable color filter 200 having the third thickness TH3 may have the highest transmittance for the blue light B among the red light R, the green light G and the blue light B, and thus operate as a blue color filter. Thus, the variable color filter 200 receiving the third filter control signal may filter lights other than the blue light B among the lights included in the incident light IL, and transfer the blue light B to the photoelectric conversion element 320.

Figure 9:
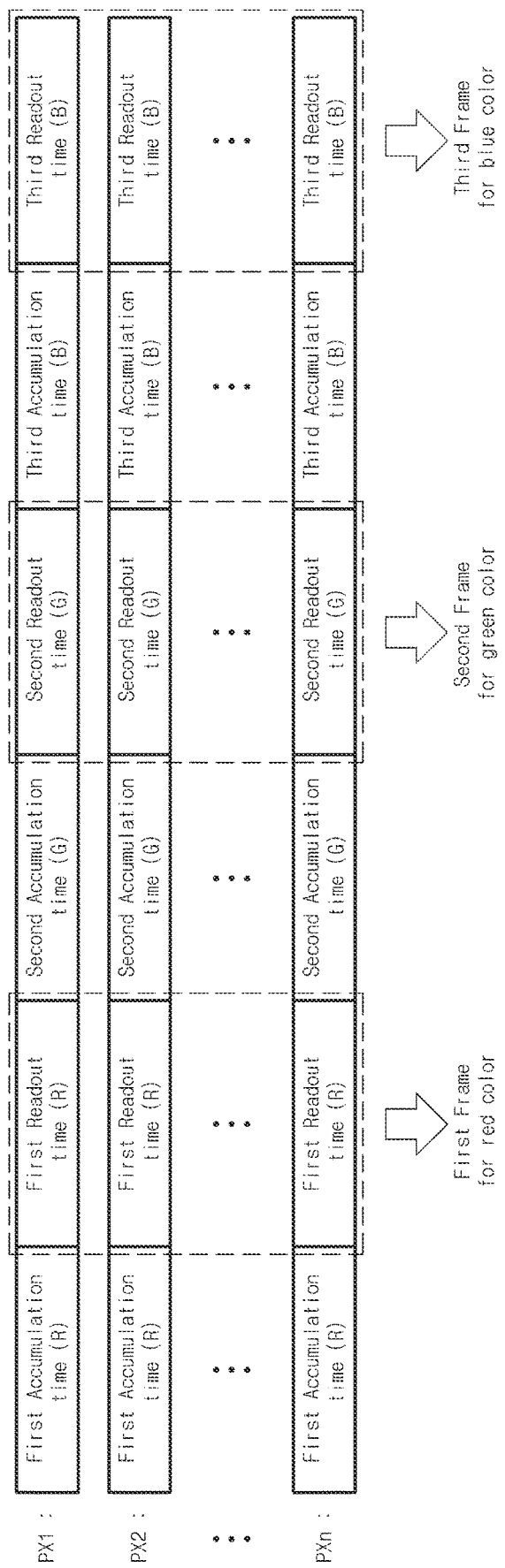
FIG. 9 is a diagram for describing an example of an operating method of an image sensing device in accordance with an embodiment of the disclosed technology.

FIG. 9 is a diagram for describing an operating method of an image sensing device in accordance with an embodiment.

Referring to FIG. 9, the pixel array 110 may include a plurality of pixels PX1 to PXn where n is an integer equal to or greater than 2. FIG. 9 illustrates sequential operations of the respective pixels PX1 to PXn.

In a first accumulation time, the filter driver 190 may apply the first filter control signal to the variable color filter 200, and the variable color filter 200 may transfer the red light R of the incident light IL to the pixels PX1 to PXn. Each of the pixels PX1 to PXn may generate and accumulate photocharges corresponding to the intensity of the red light R.

In a first readout time, each of the pixels PX1 to PXn may generate a pixel signal corresponding to the photocharges accumulated therein, and the image sensing device 100 may transfer image data, corresponding to the pixel signals generated by the plurality of pixels PX1 to PXn, to an image processor (not illustrated). The image data generated in the first readout time may be defined as a first frame corresponding to a result obtained by sensing the red light R. During the first readout time, the filter driver 190 may not apply the first filter control signal to the variable color filter 200, thereby reducing power consumption.

In a second accumulation time, the filter driver 190 may apply the second filter control signal to the variable color filter 200, and the variable color filter 200 may transfer the green light G of the incident light IL to the pixels PX1 to PXn. Each of the pixels PX1 to PXn may generate and accumulate photocharges corresponding to the intensity of the green light G.

In a second readout time, each of the pixels PX1 to PXn may generate a pixel signal corresponding to the photocharges accumulated therein, and the image sensing device 100 may transfer image data, corresponding to the pixel signals generated by the plurality of pixels PX1 to PXn, to the image processor (not illustrated). The image data generated in the second readout time may be defined as a second frame corresponding to a result obtained by sensing the green light G. During the second readout time, the filter driver 190 may not apply the second filter control signal to the variable color filter 200, thereby reducing power consumption.

In a third accumulation time, the filter driver 190 may apply the third filter control signal to the variable color filter 200, and the variable color filter 200 may transfer the blue light B of the incident light IL to the pixels PX1 to PXn. Each of the pixels PX1 to PXn may generate and accumulate photocharges corresponding to the intensity of the blue light B.

In a third readout time, each of the pixels PX1 to PXn may generate a pixel signal corresponding to the photocharges accumulated therein, and the image sensing device 100 may transfer image data, corresponding to the pixel signals generated by the plurality of pixels PX1 to PXn, to the image processor (not illustrated). The image data generated in the third readout time may be defined as a third frame corresponding to a result obtained by sensing the blue light B. During the third readout time, the filter driver 190 may not apply the third filter control signal to the variable color filter 200, thereby reducing power consumption.

In one accumulation time (for example, the first accumulation time), the plurality of pixels PX1 to PXn may receive light corresponding to the same wavelength range (or color). Furthermore, in a plurality of accumulation times (for example, the first to third accumulation times), the plurality of pixels PX1 to PXn may receive lights corresponding to different wavelength ranges (or colors).

The image processor (not illustrated) may generate RGB image data by synthesizing the first to third frames. In the conventional art, the image processor generates RGB image data using a color filter array arranged, for example, in a Bayer pattern. When the image processor generates RGB image data using image data obtained by sensing light incident through a color filter array arranged in a Bayer pattern, it is necessary to perform color interpolation using image data of adjacent pixels in order to acquire RGB image data corresponding to one pixel. However, when the image processor generates RGB image data using image data generated by the image sensing device 100 in accordance with the present embodiment, color interpolation does not need to be performed, which makes it possible to simplify the computing process of the image processor (not illustrated). Furthermore, since each of the pixels PX1 to PXn can generate pixel signals for all of the RGB lights, it is possible to prevent degradation in image data caused by color interpolation.

FIG. 9 illustrates the case in which the lights are sensed in order of the red light R, the green light G and the blue light B, but the sensing order may be changed.

In the present disclosure, the first to third filter control signals may be decided so that the variable color filter 200 can transmit the red light R, the green light G and the blue light B, respectively. However, a filter control signal may be applied to the variable color filter 200 so as to sense one or more different wavelength ranges of light (for example, magenta, yellow, and/or cyan).

In accordance with an embodiment, four or more types of filter control signals may be applied to the variable color filter 200. For example, the filter control signal applied to the variable color filter 200 may further include a fourth filter control signal to transmit infrared light, in addition to the first to third filter control signals which are decided to transmit the red light R, the green light G and the blue light B. At this time, when the image sensing device 100 includes a light source capable of emitting modulated infrared light to a scene, the image sensing device 100 may further generate a depth image through which a distance to the scene can be calculated through a ToF (Time of Flight) method, in addition to the RGB image data. Therefore, the image sensing device 100 may generate a 3D image.

The image sensing device 100 in accordance with the present embodiment may exclude a CFA (Color Filter Array) configured to allow each of the pixels to receive a different color of light, which makes it possible to solve various problems of the CFA, such as a reduction in receiving sensitivity, an occurrence of crosstalk, and an increase in level of difficulty in a CFA design/process.

In the present embodiment, it has been described that the variable color filter 200 transmits only a specific wavelength range of light using the structure forming the Fabry-Pérot interferometer. However, the scope of the present disclosure is not limited thereto, and an arbitrary structure capable of selectively transmitting only a specific wavelength range of light with respect to incident light may be used. For example, the structure may include a structure which emits a light blocking beam, which can selectively cause destructive interference or diffraction only for lights other than a specific wavelength range of light, in a direction perpendicular to the propagation direction of incident light.

While various embodiments have been described above as examples only, variations and enhancements of the described embodiments and other embodiments may be made based on what is described and/or illustrated in this patent document.

What is claimed is:

1. An image sensing device comprising:
   a variable color filter configured to receive incident light on the image sensing device and operable to vary a wavelength range of light transmitted thereby; and
   a pixel array located to receive a portion of the incident light transmitted from the variable color filter and comprising a plurality of unit pixels, each unit pixel configured to generate a pixel signal corresponding to an intensity of light having transmitted through the variable color filter,
   wherein the variable color filter comprises:
   a first plate and a second plate that are disposed to face each other and located to overlap the pixel array; and
   a piezoelectric layer disposed between the first plate and the second plate and in contact with the first plate and the second plate,
   wherein the variable color filter further comprises an optical isolation film disposed along a boundary between two adjacent unit pixels of the pixel array and between the first plate and the second plate,
   wherein the optical isolation film has the same height as the piezoelectric layer,
   wherein the optical isolation film includes a piezoelectric material, and
   wherein the optical isolation film further includes an additional material having light absorptivity.

2. The image sensing device according to claim 1, wherein each of the first plate and the second plate comprises a first surface on which a reflecting material is disposed and a second surface disposed opposite to the first surface.

3. The image sensing device according to claim 2, wherein an anti-reflection material is formed on the second surface of each of the first plate and the second plate.

4. The image sensing device according to claim 1, wherein the first plate and the second plate form a Fabry-Pérot interferometer.

5. The image sensing device according to claim 1, wherein the variable color filter is coupled to receive a filter control signal to vary the wavelength range of light transmitted through the variable color filter, and wherein the wavelength range changes based on a change in the filter control signal.

6. The image sensing device according to claim 5, further comprising: a filter driver configured to provide the filter control signal that includes a first voltage signal applied to the first plate and a second voltage signal applied to the second plate.

7. The image sensing device according to claim 6, wherein the first voltage signal and the second voltage signal have values corresponding to a wavelength range to be transmitted from the variable color filter.

8. The image sensing device according to claim 6, wherein the piezoelectric layer has a thickness corresponding to a potential difference between the first voltage signal and the second voltage signal.

9. The image sensing device according to claim 5, wherein the filter control signal is one of a first filter control signal, a second filter control signal, and a third filter control signal that respectively correspond to wavelength ranges different from one another.

10. The image sensing device according to claim 9, wherein the variable color filter to which the first filter control signal is applied has a first thickness,
   the variable color filter to which the second filter control signal is applied has a second thickness, and
   the variable color filter to which the third filter control signal is applied has a third thickness,
   wherein the first thickness is larger than the second thickness, and the second thickness is larger than the third thickness.

11. The image sensing device according to claim 9, wherein the first filter control signal to third filter control signal respectively provide first to third potential differences of signals that are applied to the two plates included in the variable color filter, and wherein the first potential difference is greater than the second potential difference that is greater than the third potential difference.

12. The image sensing device according to claim 1, wherein the variable color filter is configured to operate to transmit different colors of the light depending on a thickness of the variable color filter.

13. The image sensing device according to claim 1, wherein the optical isolation film is disposed to be aligned with an element isolation film disposed between the two adjacent unit pixels.

14. The image sensing device according to claim 1, wherein the plurality of unit pixels is configured to receive a portion of the incident light corresponding to a same wavelength range during one accumulation period.

15. The image sensing device according to claim 1, wherein the plurality of unit pixels is configured to respectively receive multiple portions of the incident light corresponding to different wavelength ranges during multiple accumulation periods.

16. The image sensing device according to claim 1, wherein the variable color filter has an area corresponding to a size of the pixel array.

17. An image sensing device comprising:
a substrate including a pixel array including a plurality of unit pixels;
a variable color filter disposed over the substrate and configured to receive a filter control signal, and vary a wavelength range of light transmitted by the variable color filter in response to the filter control signal; and
a filter driver coupled to the variable color filter and configured to generate the filter control signal for controlling the variable color filter, and apply the filter control signal to the variable color filter,
wherein the variable color filter comprises:
a first plate and a second plate that are disposed to face each other and located to overlap the pixel array; and
a piezoelectric layer disposed between the first plate and the second plate and in contact with the first plate and the second plate,
wherein the variable color filter further comprises an optical isolation film disposed along a boundary between two adjacent unit pixels of the pixel array and between the first plate and the second plate,
wherein the optical isolation film has the same height as the piezoelectric layer, and
wherein the optical isolation film includes a piezoelectric material, and
wherein the optical isolation film further includes an additional material having light absorptivity.

18. The image sensing device according to claim 17, wherein each of the first plate and the second plate comprises a first surface on which a reflecting material is disposed and a second surface disposed opposite to the first surface.

19. The image sensing device according to claim 17, wherein the variable color filter is coupled to receive a filter control signal to vary the wavelength range of light transmitted through the variable color filter, and wherein the wavelength range changes based on a change in the filter control signal.

20. The image sensing device according to claim 17, wherein the optical isolation film is disposed to be aligned with an element isolation film disposed between the two adjacent unit pixels.

* * * * *